United States Patent
Chang et al.

[11] Patent Number: 6,023,060
[45] Date of Patent: Feb. 8, 2000

[54] T-SHAPED ELECTRON-BEAM MICROCOLUMN AS A GENERAL PURPOSE SCANNING ELECTRON MICROSCOPE

[75] Inventors: Tai-Hon P. Chang, Foster City; Ho-Seob Kim, Fremont, both of Calif.

[73] Assignee: Etec Systems, Inc., Hayward, Calif.

[21] Appl. No.: 09/034,893

[22] Filed: Mar. 3, 1998

[51] Int. Cl.$^7$ .................................. H01J 3/14; G21K 7/00
[52] U.S. Cl. .............................................. 250/310; 250/397
[58] Field of Search ...................................... 250/310, 397

[56] References Cited

U.S. PATENT DOCUMENTS

| | | | |
|---|---|---|---|
| 4,588,890 | 5/1986 | Finnes | 250/307 |
| 5,122,663 | 6/1992 | Chang et al. | 205/310 |
| 5,155,412 | 10/1992 | Chang et al. | 315/14 |
| 5,424,549 | 6/1995 | Feldman | 250/492.22 |
| 5,426,686 | 6/1995 | Rentzepis et al. | 378/34 |
| 5,684,360 | 11/1997 | Baum et al. | 313/542 |
| 5,734,164 | 3/1998 | Sanford | 250/310 |

FOREIGN PATENT DOCUMENTS 07 192682  7/1995  Japan ........................ H01J 37/305

OTHER PUBLICATIONS

T.H.P. Chang et al., "Electron–beam microcolumns for lithography and related applications", J. Vac. Sci. Technol. B 14(6), Nov./Dec. 1996, 1996 American Vacuum Society, pp. 3774–3781.

T.H.P. Chang et al. "Electron beam microcolumn technology and applications", SPIE vol. 2522, Jul. 10–14, 1995, San Diego, California, 1995 by the Society of Photo–Optical Instrumentation Engineers, pp. 4–12.

T.H.P. Chang et al. "Electron beam technology—SEM to microcolumn", Microelectronic Engineering 32 (1996), 1996 Elsevier Science B.V., pp. 113–130.

H.S. Kim et al., "Miniature Schottky electron source", J.Vac. Sci. Technol. B 13(16), Nov./Dec. 1995, 1995 American Vacuum Society, pp. 2468–2472.

E. Kratschmer et al., "Experimental evaluation of a 20×20 mm footprint microcolumn", J. Vac. Sci. Technol. B 14(16), Nov./Dec. 1996, 1996 American Vacuum Society, pp. 3792–3796.

M.G.R. Thomson et al., "Lens and deflector design for microcolumns", J.Vac. Sci. Technol. B 13(6), Nov./Dec. 1995, 1995 American Vacuum Society, pp. 2445–2449.

L. Reimer, G. Pfefferkorn: "Rasterelektronenmikroskopie" 1977, Springer, Berlin Heidelberg New York XP002107231, pp. 109–118.

*Primary Examiner*—Edward P. Westin
*Assistant Examiner*—Nikita Wells
*Attorney, Agent, or Firm*—Skjerven, Morrill, MacPherson Franklin and Friel

[57] ABSTRACT

A charged particle-beam microcolumn, which for example may be used for charged particle microscopy, with a T-shape configuration has a relatively narrow base structure supporting the beam forming charged particle optical column. The narrow base structure permits the T-shaped microcolumn and sample to be positioned at an angle other than normal with respect to each other, which allows generation of three-dimensional-like images of the sample surface. Thus, the incidence angle of the charged particle beam generated by the T-shaped microcolumn may be varied while a short working distance is maintained. A conventional secondary/backscattered charged particle detector may be used because the reflected angle of the charged particles allows a charged particle detector to be separated from the T-shaped microcolumn. Further, the small size of the T-shaped microcolumn permits observation of different parts of a large stationary sample by moving the T-shaped microcolumn with respect to the sample. Moreover, multiple T-shaped microcolumns may be arrayed to improve throughput.

20 Claims, 3 Drawing Sheets

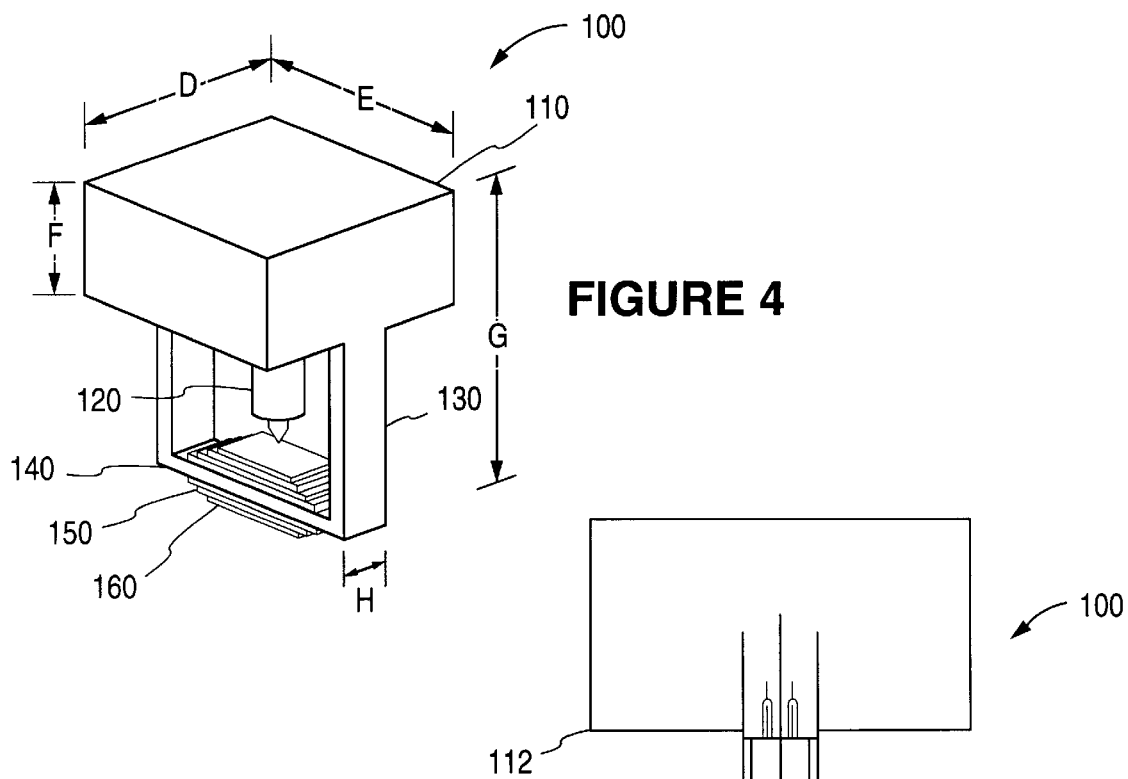
FIGURE 4
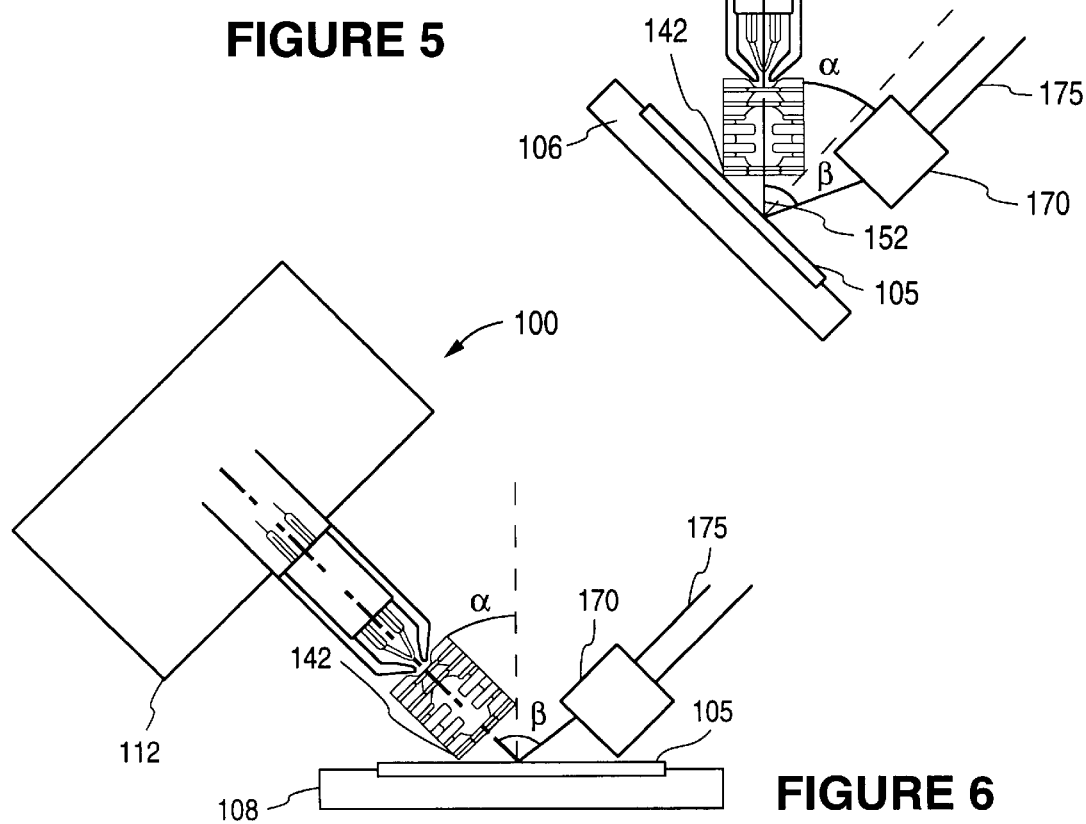
FIGURE 5
FIGURE 6

T-SHAPED ELECTRON-BEAM MICROCOLUMN AS A GENERAL PURPOSE SCANNING ELECTRON MICROSCOPE

FIELD OF THE INVENTION

The present invention relates to charged particle imaging, and more particularly to an electron-beam microcolumn capable of producing three dimensional images for scanning electron microscopy.

BACKGROUND

Conventional scanning electron microscopes are large immobile devices. Although scanning electron microscopes have many applications, such as semiconductor related inspection and testing, conventional scanning electron microscopes are limited in their usefulness because of their size, immobility, and associated costs. For instance, because the sample being observed, as opposed to the electron microscope, must be moved during the inspection process, a conventional scanning electron microscope requires the use of a vacuum chamber that is much larger than the sample. Further, the sample must be positioned at an angle relative to a conventional scanning electron microscope to produce a beam incidence angle required for three-dimensional-like surface feature imaging, which makes handling large or delicate samples difficult. Moreover, throughput of a conventional electron microscope is limited because only one electron microscope can observe a sample at a time.

An effort to improve electron-beam systems has resulted in miniature electron-beam microcolumns ("microcolumns"). Microcolumns are based on microfabricated electron "optical" components and field emission sources operating under principles similar to scanning tunneling microscope ("STM") aided alignment principles. The alignment principles used by microcolumns are similar to STMs in that a precision XY-Z positioner is used to control a sharp tip, in the case of a microcolumn a field emission tip, and to utilize the emission from the tip to measure the position of the tip. Microcolums are discussed in general in the publication "Electron-Beam Microcolumns for Lithography and Related Applications," by T. H. P. Chang et al., Journal of Vacuum Science Technology Bulletin 14(6), pp. 3774–81, November/December 1996, which is incorporated herein by reference.

A conventional box-type microcolumn 10, as shown in FIG. 1, is positioned over a sample 20 with a support arm 22. Microcolumn 10 includes a positioner housing structure 30 upon which is mounted a field emitter source 40, such as a Schottky field emitter or a cold-field emitter. Microcolumn 10 also includes a support structure 32 and base plate structure 34, which support an electron "optical" column 50 and a detector assembly 60. Electron optical column 50 consists of lenses and deflectors to form a focused beam of electrons which can be scanned over the sample surface. Microcolumn 10 typically produces a 1 keV beam with a working distance in the range of 1–5 mm (millimeters). A short working distance provides high resolution microscopy, for example down to a 10 nm (nanometer) beam diameter or less, while a longer working distance may be used for applications requiring a larger field size, for example up to 150 µm or larger. As shown in FIG. 1, the electron beam 42 produced by microcolumn 10 has a normal incidence with respect to the surface of sample 20.

FIG. 2 is a perspective view of box-type microcolumn 10 above sample 20. A typical example of a present day box-type microcolumn 10 is approximately 20×20 mm in the A and B dimensions and 22.5 mm in the C dimension as shown in FIG. 2.

FIG. 3 illustrates an exploded diagram of field emitter source 40 and electron optical column 50. Field emitter source 40 includes a field emitter tip 42, which may be a Zr/O/W Schottky field emitter tip or a cold-field emitter tip, such as a single crystal tungsten, hafnium carbide or diamond tip. Field emitter tip 42 is mounted on a three axis STM-like X-Y-Z positioner 44, which is contained in the positioner housing structure 30 shown in FIGS. 1 and 2. The X-Y-Z positioner 44 has a range of movement in the order of tens of micrometers to approximately 1 mm in the X, Y, and Z axes with nanometer-scale positioning capability and is used to align field emitter tip 42 with electron optical column 50. Typical present day dimensions of X-Y-Z positioner 44 are approximately 20×20×14 mm, which places a limitation on the dimensions of positioner housing structure 30.

The typical components of present day electron optical column 50 include a microsource lens 52 with an extractor and an anode with apertures of approximately a few micrometers and 100 µm in diameter, respectively. Microsource lens 52 is followed by a beam limiting aperture 54, approximately a few micrometers in diameter, that is tailored to achieve optimum beam performance. The extractor and anode of microsource lens 52 and beam limiting aperture 54 are silicon electrodes bonded together using Pyrex insulating spacers (not shown) that are approximately 100–500 µm thick. A double octopole deflection system 56 follows beam limiting aperture 54. Electron optical column 50 also includes an Einzel electron lens 58 that consists of three silicon electrodes with apertures of approximately 200 µm in diameter and which are separated by Pyrex insulating spacers (not shown) that are approximately 250 µm thick. The column length between field emitter tip 42 and the last electrode of Einzel lens 58 is approximately 3.5 mm.

Between Einzel lens 58 and the sample 20 is detector assembly 60. Detector assembly 60 may be a microchannel plate (MCP) based secondary/backscattered electron detector or a metal-semiconductor-metal (MSM) detector. Conventional Everhart-Thornley detectors are not used in conjunction with microcolumn 10 because of the difficulty in extracting secondary electrons to a Everhart-Thornley detector with current microcolumn design.

It is understood that FIG. 3 illustrates merely one example of many possible field emission sources and electron optical columns that may be used in microcolumn 10. For additional field emission sources and electron optical columns that may be used in microcolumn 10 and for information relating to the workings of microcolumn 10 in general, see the following articles and patents: "Experimental Evaluation of a 20×20 mm Footprint Microcolumn," by E. Kratschmer et al., Journal of Vacuum Science Technology Bulletin 14(6), pp. 3792–96, November/December 1996; "Electron Beam Technology—SEM to Microcolumn," by T. H. P. Chang et al., Microelectronic Engineering 32, pp. 113–130, 1996; "Electron Beam Microcolumn Technology And Applications," by T. H. P. Chang et al., *Electron-Beam Sources and Charged-Particle Optics*, SPIE Vol. 2522, pp. 4–12, 1995; "Lens and Deflector Design for Microcolumns," by M. G. R. Thomson and T. H. P. Chang, Journal of Vacuum Science Technology Bulletin 13(6), pp. 2445–49, November/December 1995; "Miniature Schottky Electron Source," by H. S. Kim et al., Journal of Vacuum Science Technology Bulletin 13(6), pp. 2468–72, November/December 1995; U.S. Pat. No. 5,122,663 to Chang et al.; and U.S. Pat. No. 5,155,412 to Chang et al., all of which are incorporated herein by reference.

As shown in FIG. 1, box-type microcolumn 10 produces a normal incidence electron beam that is useful primarily in applications such as lithography. However, as is well understood by those skilled in the art, for a general purpose scanning electron microscope it is important to be able to view a sample at an angle to obtain three-dimensional-like surface feature images. The 20×20 mm footprint of box-type microcolumn 10 along with its relatively short working distance (15 mm) limits the angle from which microcolumn 10 may view a sample. Consequently, the usefulness of box-type microcolumn 10 as a general purpose scanning electron microscope is limited.

SUMMARY

A "T-shaped" microcolumn with a wide positioner housing structure on top of a narrow support structure and base structure is suitable for use in a general purpose scanning electron microscope while obtaining the benefits of a microcolumn configuration. The support and base structures along with the electron optical column of the T-shaped microcolumn are all narrowed to permit the T-shaped microcolumn to be positioned at an angle other than normal with respect to a surface of the sample being scanned. The T-shaped microcolumn advantageously permits a short working distance with an angled incidence electron beam resulting in three dimensional imaging. Further, because the electron beam has an angled incidence, the T-shaped microcolumn allows use of a separate electron detector assembly that may be a conventional secondary/backscattered electron detector.

The small size of the T-shaped microcolumn allows the microcolumn to be moved, which is advantageous over the conventional immobile scanning electron microscopes. For instance, the mobility of the T-shaped microcolumn permits the microcolumn itself to be positioned at various angles with respect to a stationary sample, thus allowing a variety of beam incidence angles. In addition, the mobility of the T-shaped microcolumn permits the microcolumn to view different areas of a large sample by translating the microcolumn itself rather than moving the sample. Because large samples may be held stationary, smaller vacuum chambers may therefore be used. Moreover, throughput may be increased because multiple T-shaped microcolumns may be placed in an array to simultaneously scan a sample.

BRIEF DESCRIPTION OF THE DRAWINGS

The above and other features, aspects, and advantages of the present invention will become better understood with regard to the following description, appended claims, and accompanying figures, where:

FIG. 4 is a perspective view of a T-shaped microcolumn having narrow support and base structures in accordance with the present invention;

FIG. 5 shows a side view of T-shaped microcolumn and separate detector assembly positioned at an angle with respect to a sample in accordance with the present invention;

FIG. 6 shows a side view of a T-shaped microcolumn and separate detector assembly positioned over a sample, which is positioned at an angle with respect to the T-shaped microcolumn in accordance with the present invention;

DETAILED DESCRIPTION OF THE DRAWINGS

Figure 1:
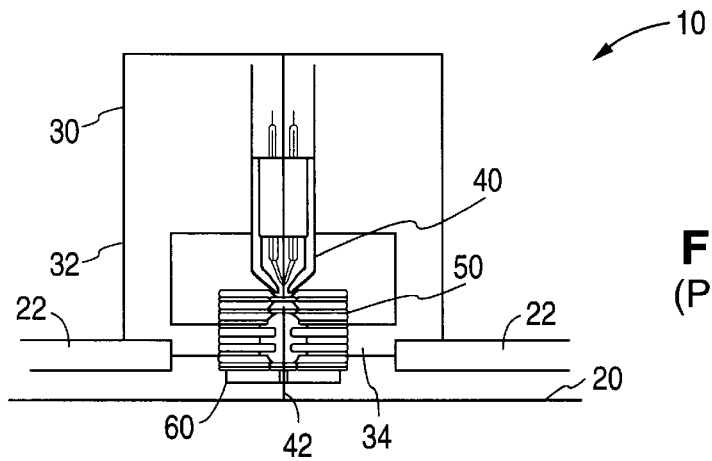
FIG. 1 shows a side view of a box-type microcolumn positioned above a sample in accordance with the prior art.

FIG. 4 is a perspective view of a T-shaped charged particle-beam microcolumn 100 having narrow support and base structures capable of use in, for example, a general purpose scanning electron microscope in accordance with an embodiment of the present invention. As illustrated in FIG. 4, T-shaped microcolumn 100 includes a positioner housing structure 110, a field emission source 120, a support structure 130, and a base structure 140 supporting an electron optical column 150 and a detector assembly 160. Positioner housing structure 110, support structure 130, and base structure 140 may be made of aluminum, ceramic, or other similarly rigid type material. Field emission source 120, electron optical column 150, and detector assembly 160 used by T-shaped microcolumn 100 may be similar in dimensions, materials, and fabrication to respectively field emission source 40, electron optical column 50, and detector assembly 60 used by box-type microcolumn 10 described with reference to FIGS. 1, 2, and 3.

The dimensions of positioner housing structure 110 are limited by the dimensions of the STM-like X-Y-Z positioner (not shown) that is contained within positioner housing structure 110. Consequently, in one example positioner housing structure 110 is approximately 20×20×14 mm in respectively the D, E, and F dimensions, as shown in FIG. 4. The G dimension of T-shaped microcolumn 100 is approximately 30 mm.

Base structure 140 of T-shaped microcolumn 100 is narrower than positioner housing structure 110 in the H dimension, as shown in FIG. 4. The H dimension of base structure 140 is approximately 4 mm. FIG. 4 shows support structure 130 as also being approximately 4 mm in the H dimension. It will be understood by one skilled in the art, however, that support structure 130 may be wider where support structure 130 joins positioner housing structure 110, i.e., support structure 130 may have a "V" shape or other similar shapes. Moreover, base structure 140 may have a smaller dimension than positioner housing structure 110 in the E dimension.

Figure 2:
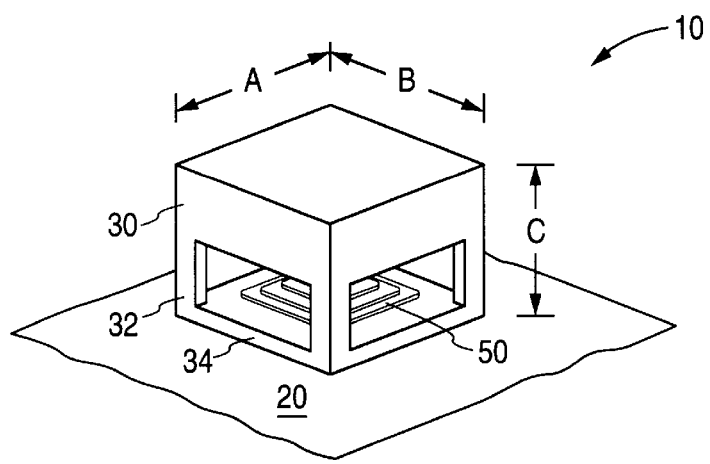
FIG. 2 is a perspective view of a box-type microcolumn positioned above a sample in accordance with the prior art.
Figure 3:
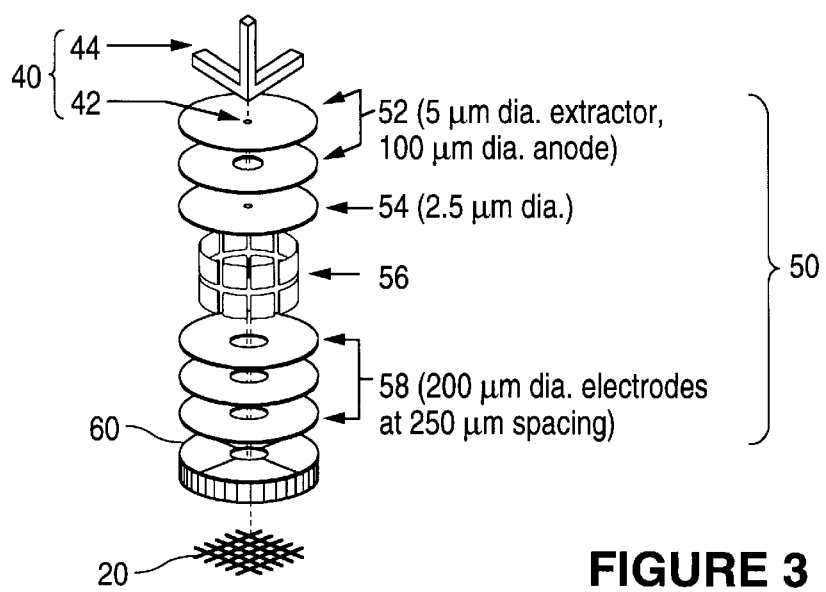
FIG. 3 illustrates an exploded schematic of the field emitter unit and the electron optical column used in a microcolumn.

Although electron optical column 150 is similar to electron optical column 50 used in box-type microcolumn 10 described in reference to FIGS. 1, 2, and 3, the fabrication of electron optical column 150 may be modified so that electron optical column 150 is narrower than positioner housing structure 110 in the H dimension, and preferably as narrow as base structure 140. Modifying the shape of electron optical column 150 is well within the skill of those in the art.

T-shaped microcolumn 100 produces a 1 keV beam with a working distance of 1–5 mm similar to box-type microcolumn 10 shown in FIG. 1. It should be understood, however, that these parameters are given by way of example and not limitation. Because supporting structure 130 and base structure 140 are narrower than positioner housing structure 110, T-shaped microcolumn 100 has the capability of maintaining a short working distance while varying the beam incidence angle by positioning the sample and microcolumn 100 at an angle with respect to each other.

FIG. 5 shows a side view of T-shaped microcolumn 100 positioned over sample 105, which is positioned at an angle with respect to a stationary T-shaped microcolumn 100. Microcolumn 100 is supported over sample 105 using a conventional mechanical support arm (not shown) or in any other appropriate manner. Sample 105 is held by a conventional support 106, which may be a silicon wafer holder or any other appropriate support device. FIG. 5 also shows a separate conventional detector assembly 170 used in conjunction with T-shaped microcolumn 100 to detect electrons reflected from sample 105.

Because support 106 positions sample 105 at an angle with respect to T-shaped microcolumn 100, the electron beam 152 has an incidence angle α from normal to sample 105 (normal is illustrated as a dotted line) causing the electrons to be reflected from sample 105 at an angle α from normal. Separate detector assembly 170, which is mounted on a support arm 175, is positioned at an angle β from T-shaped microcolumn 100 to detect the reflected electron beam. The position of detector assembly 170 is not critical and may be adjusted to ensure that detector assembly 170 will detect the electrons reflected off sample 105 if the angle of sample 105 relative to T-shaped microcolumn 100 is changed.

Unlike the detector assembly 60 used with box-type microcolumn 10 in FIG. 1, detector assembly 170 is not limited to a planar type such as an MCP type detector, because the electron beam does not travel through detector assembly 170. Thus detector assembly 170 may be any conventional secondary/backscattered electron detector, such as an Everhart-Thornley detector or Schottky diode type solid-state detector. Of course, it is desirable for T-shaped microcolumn 100 to include an MCP type detector as detector assembly 160, shown in FIG. 4, so that T-shaped microcolumn 100 may also detect a normal incidence electron beam.

As shown in FIG. 5, T-shaped microcolumn 100 may be used to view sample 105 at an angle from normal because of the narrow support and base structures 130 and 140. Consequently, T-shaped microcolumn 100 may be used as a general purpose scanning electron microscope with three dimensional imaging. The particular angle a with which T-shaped microcolumn 100 views sample 105 is variable, and is limited only by the working distance and either the edge 142 of base structure 140 or the edge 112 of positioner housing structure 110. Due to the particular dimensions of T-shaped microcolumn 100 as shown in FIG. 4, the maximum angle between T-shaped microcolumn 100 and sample 105 may be approximately 18.4° from normal at a working distance of 1 mm, and approximately 59° from normal at a working distance of 5 mm.

FIG. 6 shows a side view of T-shaped microcolumn 100 positioned at an angle with respect to a stationary sample 105. Because of the small size of T-shaped microcolumn 100, T-shaped microcolumn 100 may advantageously be moved into different positions relative to sample 105, which is held in a stationary support 108. Thus, unlike a conventional scanning electron microscope, T-shaped microcolumn 100 itself may be positioned at an angle with respect to sample 105.

Again, the electron beam produced by T-shaped microcolumn 100 will be at an angle α from normal to sample 105 (normal is shown as a dotted line). The angle that T-shaped microcolumn 100 may be positioned at relative to sample 105 is limited by the working distance and either edge 142 or 112 of respective base structure 140 or positioner housing structure 110, shown in FIG. 4. In FIG. 6, detector assembly 170 may be adjusted in response to the position of T-shaped microcolumn 100 to maintain the proper angle to detect reflected electrons.

Figure 7:
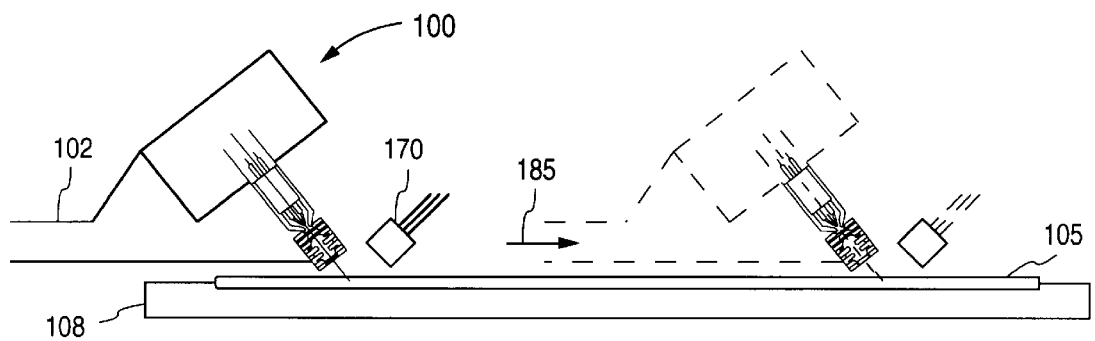
FIG. 7 shows a side view of a T-shaped microcolumn and separate detector assembly moving over a large stationary sample in accordance with the present invention.

FIG. 7 illustrates a side view of T-shaped microcolumn 100 and detector assembly 170 moving over sample 105, which is held stationary by support 108. FIG. 7 shows T-shaped microcolumn 100 supported by a support arm 102 over sample 105 and positioned at an angle with respect to sample 105. Because of the small size of T-shaped microcolumn 100, T-shaped microcolumn 100 may advantageously be translated laterally relative to stationary sample 105.

As shown in FIG. 7, support arm 102 conventionally translates T-shaped microcolumn 100 and detector assembly 170 at a desired velocity, such as approximately 1 cm/sec, over the surface of sample 105 in a direction indicated by arrow 185. Detector assembly 170 may be mechanically supported by T-shaped microcolumn 100 as discussed in reference to FIG. 6, or may be supported directly by support arm 102. Support arm 102 is driven by an actuator, such as a linear servo motor and ball screw, by rotary means, or by any other appropriate manner as is well known in the art. Additionally, support arm 102 may permit microcolumn to be positioned at various angles with respect to sample 105. FIG. 7 illustrates the change of position of T-shaped microcolumn 100, detector assembly 170, and support arm 102 with a later position of T-shaped microcolumn 100, detector assembly 170, and support arm 102 shown in phantom lines.

The small size and mobility of T-shaped microcolumn 100, as shown in FIG. 7, provide an advantage over conventional scanning electron microscopes. When a large sample is being observed, for example, a 12" diameter semiconductor wafer, T-shaped microcolumn 100 may be translated relative to the sample to view different locations on the sample. Conventional scanning electron microscopes, on the other hand, require the sample to be translated. Thus, the mobility of T-shaped microcolumn 100 significantly reduces the size of the vacuum chamber required to contain the sample during scanning because the vacuum chamber may be only slightly larger than the sample itself.

Figure 8:
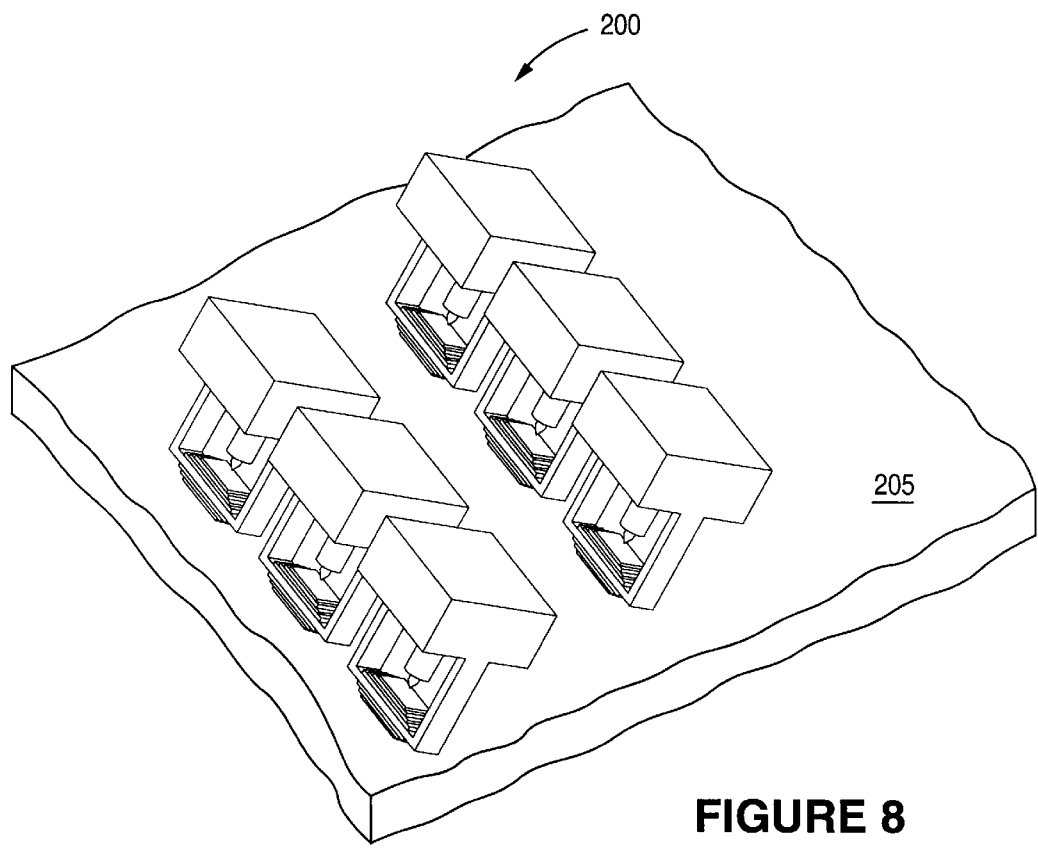
FIG. 8 shows an array of T-shaped microcolumns positioned at an angle with respect to a sample in accordance with the present invention.

Another advantage of the small size of T-shaped microcolumn 100 is the ability to place it in an array of many identical T-shaped microcolumns. FIG. 8 illustrates an array 200 of identical T-shaped microcolumns each positioned at an angle with respect to a sample 205. Each T-shaped microcolumn in array 200 has an associated separate detector assembly, which is not shown in FIG. 8 for the sake of clarity. Array 200 may be of any size and have any desired number of T-shaped microcolumns. In addition, the angle that each T-shaped microcolumn in array 200 is positioned with respect to sample 205 may be varied. Moreover, array 200 may be laterally translated over the surface of sample 205 as discussed with reference to FIG. 7, or in the alternative, sample 205 may be moved with respect to array 200.

FIG. 8 illustrates another advantage that a T-shaped microcolumn in accordance with the present invention has over the conventional scanning electron microscopes. Although there is a limit to the proximity of the electron beams produced by each T-shaped microcolumn, using an array 200 with multiple T-shaped microcolumns properly staggered in rows permits substantially the entire surface of sample 205 to be observed in relatively few passes. Thus, by increasing the number of T-shaped microcolumns placed in an array 200 and by staggering the rows in array 200, the throughput of the scanning electron microscope is increased dramatically.

Although the present invention has been described in considerable detail with reference to certain versions thereof, other versions are possible. For example, the T-shaped microcolumn and sample may be both moved (angularly or laterally) with respect to each other. Alternative configurations and dimensions of the microcolumn having a narrow base structure may be used to permit viewing a sample at an angle in accordance with an embodiment of the present invention. In addition, other applications for T-shaped microcolumn are possible, such as normal incidence scanning for electron beam lithography, in which case the need for separate detector assembly 170 is obviated. Therefore, the spirit and scope of the appended claims should not be limited to the description of the versions depicted in the figures.

What is claimed is:

1. A charged particle beam imaging apparatus, comprising:
   a support for holding a sample; and
   a charged particle beam microcolumn defining an axis and positioned over said support, said charged particle beam microcolumn having a housing structure, a support structure downwardly depending from said housing structure, and a base structure connected to said support structure, said base structure being narrower than said housing structure;
   wherein said axis of said charged particle beam microcolumn is at an angle other than normal with respect to a principal surface of said support.

2. The charged particle beam imaging apparatus of claim 1, wherein said charged particle beam microcolumn emits an electron beam and said housing structure supports a field emitter tip connected to a positioner.

3. The charged particle beam imaging apparatus of claim 1, further comprising a charged particle detector assembly defining an axis, said axis of said charged particle detector assembly being at an angle with respect to said axis of said charged particle beam microcolumn.

4. The charged particle beam imaging apparatus of claim 3, wherein said charged particle detector assembly is an Everhart-Thornley detector.

5. The charged particle beam imaging apparatus of claim 1, wherein said angle is variable.

6. The charged particle beam imaging apparatus of claim 1, wherein said support holds said sample stationary and said charged particle beam microcolumn is positioned at an angle other than normal with respect to said principal surface of said support.

7. The charged particle beam imaging apparatus of claim 1, wherein said charged particle beam microcolumn is moved laterally with respect to said support.

8. The charged particle beam imaging apparatus of claim 1, further comprising:
   multiple charged particle beam microcolumns positioned in an array over said support, each of said multiple charged particle beam microcolumns having a housing structure, a support structure downwardly depending from said housing structure, and a base structure connected to said support structure, said base structure being narrower than said housing structure, wherein each of said multiple charged particle beam microcolumns is at an angle other than normal with respect to a principal surface of said support; and
   each of said multiple charged particle beam microcolumns having an associated charged particle detector assembly being at an angle other than normal with respect to said principal surface of said support.

9. A method of scanning charged particle microscopy, said method comprising:
   positioning a first charged particle beam microcolumn defining an axis and a sample having a principal surface so that said axis and said principal surface are at an angle other than normal with respect to each other;
   positioning a first charged particle detector assembly defining an axis at an angle other than normal with respect to said principal surface of said sample;
   generating a charged particle beam from said first charged particle beam microcolumn; and
   detecting with said first charged particle detector assembly said charged particle beam reflected from said principal surface of said sample.

10. The method of scanning charged particle microscopy of claim 9, wherein said first charged particle beam microcolumn emits an electron beam, and said first charged particle detector assembly is an electron detector assembly.

11. The method of scanning charged particle microscopy of claim 9, said method further comprising:
    maintaining said sample stationary; and
    positioning said first charged particle beam microcolumn at an angle other than normal with respect to said surface of said sample.

12. The method of scanning charged particle microscopy of claim 9, said method further comprising
    maintaining said sample stationary; and
    moving said first charged particle beam microcolumn and said first charged particle detector assembly in a lateral direction relative to said surface of said sample.

13. The method of scanning charged particle microscopy of claim 9, said method further comprising:
    positioning a plurality of charged particle beam microcolumns having a plurality of charged particle detector assemblies in an array, each of said plurality of charged particle beam microcolumns defining an axis at an angle other than normal with respect to said principal surface of said sample;
    generating a plurality of charged particle beams from said plurality of charged particle beam microcolumns; and
    detecting with said plurality of charged particle detector assemblies said plurality of charged particle beams reflected from said principal surface of said sample.

14. A charged particle beam microcolumn apparatus comprising:
    a charged particle source;
    a housing structure containing a positioner, wherein said positioner positions said charged particle source, said housing structure having a first dimension in a first direction and a second dimension in a second direction orthogonal to said first direction;
    a lens for focusing said charged particles from said source into a charged particle beam;
    a base structure connected to said housing structure, wherein said base structure supports said lens, said base structure having a third dimension in said first direction, wherein said third dimension of said base structure is less than said first dimension of said housing structure; and
    a support for holding a sample;
    wherein said charged particle beam microcolumn apparatus defines an axis which is positioned at an angle other than normal with respect to a principal surface of said support.

15. The charged particle beam microcolumn apparatus of claim 14, wherein said charged particle beam microcolumn is an electron beam microcolumn.

16. The charged particle beam microcolumn apparatus of claim 14, wherein said source comprises a Zr/O/W Schottky field emitter tip.

17. The charged particle beam microcolumn apparatus of claim 14, wherein said lens comprises an Einzel lens.

18. The charged particle beam microcolumn apparatus of claim 14, further comprising:

a detector for detecting charged particles reflected from said sample; and a support arm, wherein said support arm supports said detector;

wherein said detector is spaced apart from said charged particle beam microcolumn.

19. The charged particle beam microcolumn apparatus of claim 18, wherein said detector comprises an Everhart-Thornley detector.

20. The charged particle beam microcolumn apparatus of claim 18, wherein said detector comprises a Schottky diode type solid-state detector.

* * * * *